US011243711B2

(12) United States Patent
Sato

(10) Patent No.: US 11,243,711 B2
(45) Date of Patent: Feb. 8, 2022

(54) CONTROLLING FIRMWARE STORAGE DENSITY BASED ON TEMPERATURE DETECTION

(71) Applicant: Micron Technology, Inc., Boise, ID (US)

(72) Inventor: Junichi Sato, Yokohama (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/783,016

(22) Filed: Feb. 5, 2020

(65) Prior Publication Data
US 2021/0240381 A1 Aug. 5, 2021

(51) Int. Cl.
*G06F 3/06* (2006.01)

(52) U.S. Cl.
CPC ............ *G06F 3/0653* (2013.01); *G06F 3/065* (2013.01); *G06F 3/0616* (2013.01); *G06F 3/0679* (2013.01)

(58) Field of Classification Search
CPC .......................... G06F 3/0653; G06F 12/0246
See application file for complete search history.

(56) References Cited

U.S. PATENT DOCUMENTS

| | | | |
|---|---|---|---|
| 9,547,588 B1 * | 1/2017 | Biederman | G06F 12/0246 |
| 2008/0112221 A1 | 5/2008 | Park et al. | |
| 2010/0169547 A1 | 7/2010 | Ou | |
| 2011/0107049 A1 | 5/2011 | Kwon et al. | |
| 2011/0199823 A1 * | 8/2011 | Bar-or | G11C 11/5628 |
| | | | 365/185.03 |
| 2012/0224425 A1 | 9/2012 | Fai et al. | |
| 2013/0145085 A1 | 6/2013 | Yu et al. | |
| 2013/0326313 A1 | 12/2013 | Khan | |
| 2014/0250257 A1 | 9/2014 | Khan et al. | |
| 2014/0281167 A1 | 9/2014 | Danilak et al. | |
| 2014/0281170 A1 * | 9/2014 | Cho | G06F 8/63 |
| | | | 711/103 |
| 2014/0340246 A1 | 11/2014 | Wu | |
| 2015/0092488 A1 | 4/2015 | Wakchaure et al. | |

(Continued)

OTHER PUBLICATIONS

Parnell, Thomas, "NAND Flash Basics & Error Characteristics: Why Do We Need Smart Controllers." Flash Memory Summit 2016, retrieved from the Internet on Jan. 16, 2021 <URL: https://www.flashmemorysummit.com/English/Collaterals/Proceedings/2016/20160808_PreConfH_Parnell.pdf>, 2016.

(Continued)

*Primary Examiner* — Edward J Dudek, Jr.
(74) *Attorney, Agent, or Firm* — Greenberg Traurig

(57) ABSTRACT

A data storage device stores data in non-volatile memory. In one approach, a method includes: storing software in a compressed format in a first mode (e.g., an SLC mode) in a non-volatile memory; exposing, while the software is stored in the first mode, the non-volatile memory to a temperature greater than a predetermined threshold; determining that the temperature of the non-volatile memory has fallen below the predetermined threshold; and in response to determining that the temperature of the non-volatile memory has fallen below the predetermined threshold: decompressing the stored software, and storing the decompressed software in a second mode (e.g., TLC mode) in the non-volatile memory. The second mode has a storage density higher than the first mode.

19 Claims, 5 Drawing Sheets

(56) References Cited

U.S. PATENT DOCUMENTS

| | | |
|---|---|---|
| 2015/0143026 A1 | 5/2015 | Reddy et al. |
| 2016/0125059 A1 | 5/2016 | Jain et al. |
| 2016/0268000 A1 | 9/2016 | Thompson et al. |
| 2016/0371190 A1 | 12/2016 | Romanovskiy |
| 2017/0017281 A1 | 1/2017 | Artman et al. |
| 2017/0153814 A1 | 6/2017 | Ryu et al. |
| 2017/0206979 A1 | 7/2017 | Cohen et al. |
| 2018/0039537 A1 | 2/2018 | Chih et al. |
| 2019/0050153 A1* | 2/2019 | Yang ................ G06F 1/206 |
| 2019/0095321 A1 | 3/2019 | Lin et al. |
| 2020/0042223 A1* | 2/2020 | Li ................ G06F 12/0246 |
| 2020/0272363 A1 | 8/2020 | Sato |
| 2020/0293439 A1* | 9/2020 | Kodama ............ G06F 13/385 |

OTHER PUBLICATIONS

International Search Report and Written Opinion, PCT/US2020/019001, dated Jun. 15, 2020.
International Search Report and Written Opinion, PCT/US2021/015265, dated May 13, 2021.
International Search Report and Written Opinion, PCT/US2021/015266, dated Apr. 22, 2021.

* cited by examiner

CONTROLLING FIRMWARE STORAGE DENSITY BASED ON TEMPERATURE DETECTION

RELATED APPLICATIONS

The present application is related to U.S. Non-Provisional application Ser. No. 16/281,740, filed Feb. 21, 2019, entitled "REFLOW ENDURANCE IMPROVEMENTS IN TRIPLE-LEVEL CELL NAND FLASH," by Junichi Sato, the entire contents of which application is incorporated by reference as if fully set forth herein.

FIELD OF THE TECHNOLOGY

At least some embodiments disclosed herein relate to semiconductor memory and methods in general, and more particularly, but not limited to improvements for memory data storage processing based on temperature.

BACKGROUND

Various types of non-volatile storage devices can be used to store data. Non-volatile storage devices can include NAND flash memory devices. NAND flash is a type of flash memory constructed using NAND logic gates. Alternatively, NOR flash is a type of flash memory constructed using NOR logic gates. Currently, the use of NAND flash predominates the flash market.

Typical computer storage devices have controllers that receive data access requests from host computers and perform programmed computing tasks to implement the requests in ways that may be specific to the media and structure configured in the storage devices. In one example, a flash memory controller manages data stored in flash memory and communicates with a computer device. In some cases, flash memory controllers are used in solid state drives for use in mobile devices, or in SD cards or similar media for use in digital cameras.

Firmware can be used to operate a flash memory controller for a particular storage device. In one example, when a computer system or device reads data from or writes data to a flash memory device, it communicates with the flash memory controller.

Typically, a flash memory controller includes a flash translation layer (FTL) that maps logical block addresses (LBAs) received from a host device to physical addresses of flash memory. By doing so, the FTL provides a logical-to-physical mapping.

In typical flash memories, NAND or NOR transistors are used to store information and are arranged in arrays or grids of gates accessible via bit and word lines, the intersection of which is referred to as a cell. The simplest flash memories store one bit of information per cell and are referred to as single-level cell (SLC) flash memories. In a multi-level cell (MLC) flash, a cell stores more than one bit of information. Specifically, traditionally MLC flash has stored two bits of information per cell. Correspondingly, triple-level cell (TLC) flash stores three bits of information per cell, and a quad-level cell (QLC) flash stores four bits of information per cell.

The principle tradeoffs between SLC and MLC, TLC, or QLC flash are cost and speed. SLC flash, storing one bit per cell, has the fastest access times, but also costs significantly more than MLC, TLC, or QLC flash. Conversely, QLC flash has the slowest access, but has the lowest cost. MLC and TLC flash fall between SLC flash and QLC flash, wherein MLC flash is faster and more expensive than TLC flash, and TLC flash is faster and more expensive than QLC flash. Both, however, are slower and cheaper than SLC flash. Additionally, MLC, TLC, and QLC flash has lower endurance than SLC flash and suffers from higher error rates and heat sensitivity.

A hybrid type of flash is referred to as pseudo SLC (pSLC). In a pSLC flash device, a physical MLC or TLC flash array is operated in an SLC mode. That is, despite having multiple transistors per cell, the MLC/TLC flash array only utilizes one of these cells, effectively acting as an SLC device. pSLC flash is sometimes referred to as enhanced MLC (eMLC), iSLC, super MLC, MLC+, turbo MLC, or by other names.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
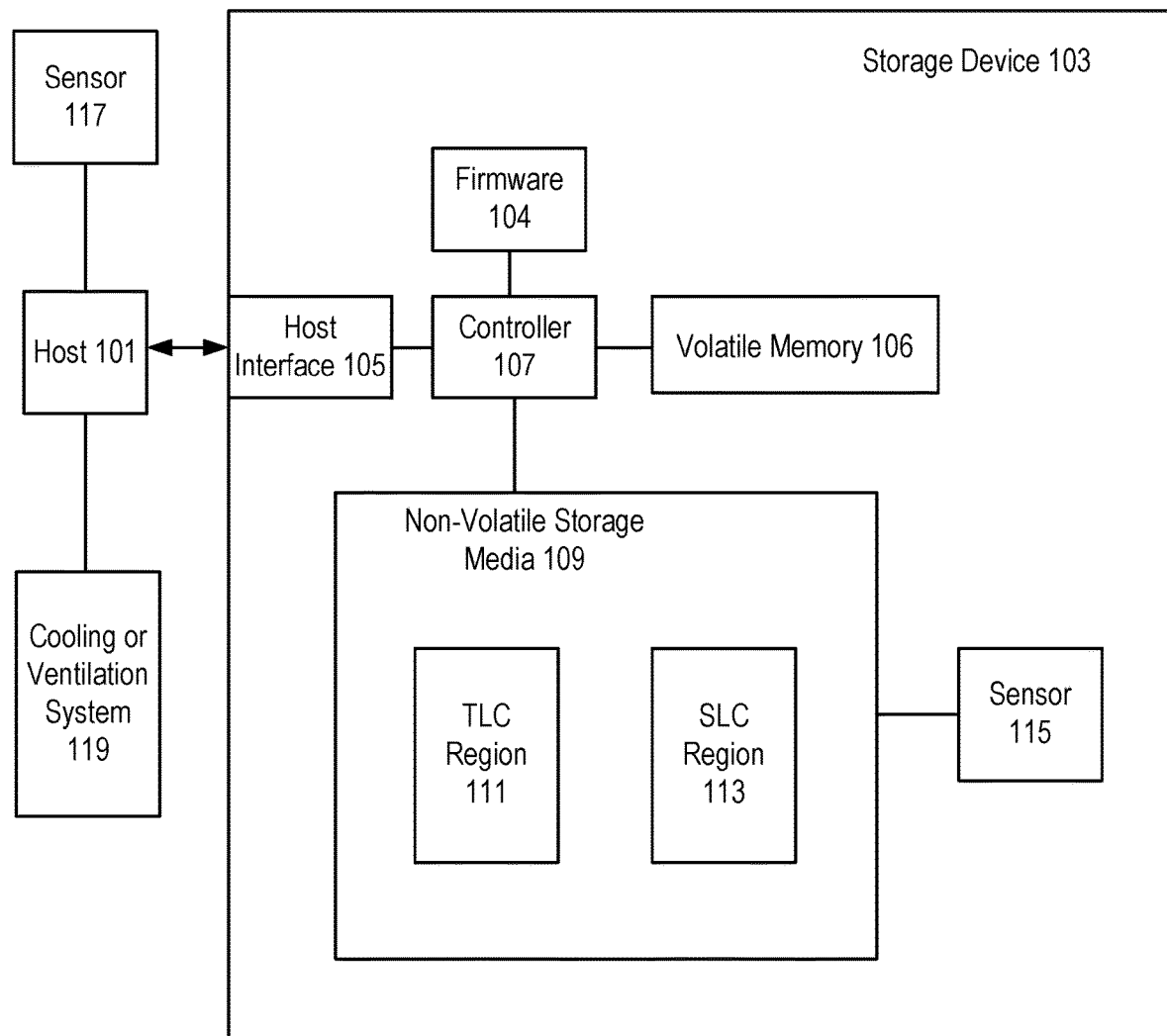
FIG. 1 illustrates a storage device including a sensor to monitor a temperature of a non-volatile storage media that stores data in a TLC region and an SLC region, in accordance with some embodiments.

The following disclosure describes various embodiments for improving the operation of flash memories. At least some embodiments herein relate to managing data storage in a flash memory storage device based on monitoring one or more temperatures associated with operation of the storage device (e.g., monitoring an internal storage media temperature). The storage device may, for example, store data used by a host device (e.g., a computing device of an autonomous vehicle, or another computing device that accesses data stored in the storage device). In one example, the storage device is a solid-state drive mounted in an electric vehicle.

Other embodiments relate to changing a storage density for data stored in a storage device (e.g., a NAND flash drive). In one embodiment, the data is software that is loaded into non-volatile memory of the storage device (e.g., boot code software loaded during manufacturing of a solid-state drive). The software is stored in a first mode having a lower storage density (e.g., an SLC mode). While stored in the first mode, the storage device is exposed to one or more manufacturing operations subject to elevated temperatures. The lower storage density aids in maintaining data integrity during the elevated temperature exposure. After determining the temperature has fallen below a predetermined threshold, the software is stored in a second mode in the non-volatile memory. The second mode has a higher storage density (e.g., a TLC mode). These embodiments are described in the section below titled "Controlling Data Storage Density Based on Temperature".

In prior flash memories, the heat generated during operation of a storage device and/or the elevated operating temperature of an environment in which the storage device operates causes a technical problem. In particular, data stored in the storage device can be lost due to exposure of a data storage media of the storage device to excessive temperatures. This data loss significantly degrades performance of the storage device by reducing the reliability of the stored data.

In one example, data can be lost from some of the memory cells of the storage media due to failure caused by elevated temperature. In one example, demands on a controller of the storage device for error correction or other failure processing (e.g., running of diagnostics) is significantly increased. In one example, responsiveness of the storage device to a host device is degraded as the storage device needs to handle an increased number and/or rate of data storage failure events.

Various embodiments of the present disclosure provide a technological solution to one or more of the above technical problems. In one embodiment, in order to avoid data loss, a data storage device monitors the storage media temperature and adjusts data storage operations of the storage device based on the monitored and/or a predicted future temperature of the storage media.

In one example, when the storage media temperature is increasing (e.g., the temperature is detected to exceed a predetermined threshold), data stored in a TLC mode can be re-saved in a compressed, SLC mode to trade performance for reliability. When the media temperature returns to a suitable range (e.g., the media temperature is determined to have fallen below the predetermined threshold, or below a different threshold), the data can be decompressed and stored in, for example, TLC or QLC mode for improved storage capacity (data can be stored in a TLC or QLC mode at a higher density than when stored in an SLC mode).

In one embodiment, a cooling or ventilation system (e.g., an HVAC system) of a vehicle can be activated automatically to prevent the memory media from reaching extreme temperatures. In one example, the cooling system is activated based on a signal from a controller of the storage device. The signal is generated when the controller determines that the storage media temperature has, or will in the future, exceed a fixed temperature limit.

In one example, a temperature sensor is coupled to send sensor data to the controller. The controller evaluates the sensor data to determine the temperature and/or predict a future temperature.

In one embodiment, the controller uses a machine learning model to predict the temperature. In one example, the model is an artificial neural network. In one example, the machine learning model uses input data including the sensor data from a sensor in the storage device and/or sensor data from a sensor external to the storage device.

In one embodiment, a method for a storage device comprises: storing, by a controller of the storage device, first data in a first mode (e.g., a TLC mode) in a non-volatile storage media; monitoring at least one temperature associated with the non-volatile storage media; and adjusting, based on monitoring the at least one temperature, a manner of storage of the first data. Adjusting the manner of storage comprises: compressing the first data to provide compressed data, and storing the compressed data in a second mode (e.g., an SLC mode) in the non-volatile storage media. The first mode has a storage density greater than the second mode.

In one example, the non-volatile storage media includes both TLC and SLC flash arrays. In one example, the non-volatile storage media uses only triple-level cell flash, but includes at least a region of a flash array that is pseudo SLC (e.g., a portion of a TLC flash array is operated in an SLC mode).

FIG. 1 illustrates a storage device 103 including a sensor 115 to monitor a temperature of a non-volatile storage media 109 that stores data in a TLC region 111 and an SLC region 113, in accordance with some embodiments. In FIG. 1, a host 101 communicates with storage device 103 via a communication channel having a predetermined protocol. The host 101 can be a computer (e.g., mobile phone or other computing device) having one or more central processing units (CPUs) to which computer peripheral devices, such as the storage device 103, may be attached via an interconnect, such as a computer bus.

The computer storage device 103 can be used to store data for the host 101. Examples of computer storage devices in general include solid state drives, flash memory, etc. The storage device 103 has a host interface 105 that implements communications with the host 101 using the communication channel. For example, the communication channel between the host 101 and the storage device 103 is a bus in one embodiment; and the host 101 and the storage device 103 communicate with each other using the eMMC or UFS protocol.

In some implementations, the communication channel between the host 101 and the storage device 103 includes a computer network, such as a local area network, a wireless local area network, a wireless personal area network, a cellular communications network, a broadband high-speed always-connected wireless communication connection (e.g., a current or future generation of mobile network link); and the host 101 and the storage device 103 can be configured to communicate with each other using various data storage management and usage commands.

The storage device 103 has a controller 107 that runs firmware 104 to perform operations responsive to the communications from the host 101. Firmware in general is a type of computer program that provides control, monitoring, and data manipulation of engineered computing devices. In FIG. 1, the firmware 104 controls the operations of the controller 107 in operating the storage device 103, such as translating a logical address to a physical address for storing and accessing data in the storage device 103. In one example, the controller is an internal controller of a managed NAND device that stores data in TLC NAND flash memory.

An example of the non-volatile storage media 109 is memory cells (e.g., SLC, TLC, QLC) in an integrated circuit. The storage media 109 is non-volatile in that no power is required to maintain the data/information stored in the non-volatile storage media 109, which data/information can be retrieved after the non-volatile storage media 109 is powered off and then powered on again. The memory cells may be implemented using various memory types, such as NAND gate based flash memory, phase-change memory (PCM), magnetic memory (MRAM), resistive random-access memory, and 3D XPoint, such that the storage media 109 is non-volatile and can retain data stored therein without power for days, months, and/or years.

In one embodiment, storage device 103 is configured to store data for host 101 in non-volatile storage media 109 using either a first mode or second mode. The first mode has a storage density greater than the second mode. In one example, the first mode is a TLC mode in which data is stored in a TLC flash array of TLC region 111. The second mode is an SLC mode in which data is stored in an SLC flash array of SLC region 113. The mode of operation that is used is controlled by controller 107. In one example, the mode of operation is selected based on sensor data from sensor 115.

In one embodiment, sensor 115 is used to monitor a temperature of non-volatile storage media 109. In one example, sensor 115 is a temperature sensor that is integrated as part of an integrated circuit that includes TLC region 111 and/or SLC region 113.

In one embodiment, during normal operation of storage device 103, controller 107 stores data for host 101 using TLC region 111. Controller 107 monitors one or more temperatures associated with non-volatile storage media 109. In one example, this monitoring includes analyzing sensor data that is received from sensor 115.

Based on data collected from one or more sensors (e.g., sensor 115), controller 107 adjusts a manner of storage of data in non-volatile storage media 109. In one example, controller 107 determines that a temperature of storage media 109 has or will exceed a predetermined temperature threshold. In response to this determination, data stored in TLC region 111 is copied to SLC region 113. The copied data is compressed prior to storing the data in SLC region 113.

In one embodiment, a sensor 117 is mounted externally to storage device 103. In one example, sensor 117 is mounted on an exterior of, but in contact with, the packaging of storage device 103. In another example, sensor 117 is mounted separately from storage device 103 (e.g., sensor 117 and storage device 103 are each mounted in an engine compartment of a vehicle).

In one embodiment, host 101 collects sensor data from sensor 117. Host 101 uses the collected sensor data to determine a temperature associated with storage device 103. In one example, the temperature is an ambient temperature of storage device 103. In one example, the ambient temperature is a temperature of an atmosphere in which storage device 103 is located.

In one embodiment, host 101 uses sensor data collected from sensor 117 and sensor 115 to make a determination regarding the current temperature and/or a projected future temperature of storage device 103 and/or storage media 109. In one example, in response to making a determination regarding the current or future temperature, host 101 activates a cooling or ventilation system 119 that is configured to lower a temperature associated with storage device 103. In one example, cooling system 119 lowers an ambient temperature of storage device 103. In one example, cooling system 119 lowers the temperature of storage media 109 (e.g., by flowing a coolant near and/or through at least a portion of storage device 103).

The storage device 103 includes volatile random-access memory (RAM) 106. In one embodiment, a portion of the RAM is used for the storage of run-time data and instructions used by the controller 107 to improve the computation performance of the controller 107 and/or provide buffers for data transferred between the host 101 and the non-volatile storage media 109. RAM 106 is volatile in that it requires power to maintain the data/information stored therein, which data/information is lost immediately or rapidly when the power is interrupted.

Volatile memory 106 typically has less latency than non-volatile storage media 109, but loses its data quickly when power is removed. Thus, in some cases, it is advantageous to use the volatile memory 106 to temporarily store instructions and/or data used for the controller 107 in its current computing task to improve performance. In some instances, the volatile memory 106 is implemented using volatile static random-access memory (SRAM) that uses less power than DRAM in some applications.

During operation, controller 107 receives various commands from host 101. These commands can include a read command or a write command. In one example, a read command includes a logical address, and is received from host 101 to access stored data in non-volatile storage media 109.

In one example, controller 107 receives a logical address and determines a physical address. The physical address that is determined is used to read that portion of stored data that corresponds to the received logical address. Controller 107 then sends the read data to host 101.

In some instances, the controller 107 has multiple processors, each having its own in-processor cache memory. Optionally, the controller 107 performs data intensive, in-memory processing using data and/or instructions organized in the storage device 103. For example, in response to a request from the host 101, the controller 107 performs a real-time analysis of a set of data stored in the storage device 103 and communicates a reduced data set to the host 101 as a response. For example, in some applications, the storage device 103 is connected to real-time sensors to store sensor inputs (e.g., sensors of an autonomous vehicle or digital camera); and the processors of the controller 107 are configured to perform machine learning and/or pattern recognition based on the sensor inputs to support an artificial intelligence (AI) system that is implemented at least in part via the storage device 103 and/or the host 101.

The storage device 103 can be used in various computing systems, such as a cloud computing system, an edge computing system, a fog computing system, and/or a standalone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage. A fog computing system uses one or more end-user devices or near-user edge devices to store data and thus reduces or eliminates the need to store the data in a centralized data warehouse.

At least some embodiments of the disclosures herein can be implemented using computer instructions executed by the controller 107, such as the firmware 104. In some instances, hardware circuits can be used to implement at least some of the functions of the firmware 104. The firmware 104 can be initially stored in the non-volatile storage media 109, or another non-volatile device, and loaded into the volatile memory 106 and/or the in-processor cache memory for execution by the controller 107.

The firmware 104 can be configured to use the techniques discussed herein that adjust a manner of data storage based on monitoring temperature. However, the techniques discussed herein are not limited to being used in the computer system of FIG. 1 and/or the examples discussed above.

A non-transitory computer storage medium can be used to store instructions of the firmware 104. When the instructions are executed by the controller 107 of the computer storage device 103, the instructions cause the controller 107 or other processing device(s) to perform a method discussed herein.

In one example, the non-volatile storage media 109 of the storage device 103 has memory units that may be identified by a range of LBA addresses, where the range corresponds to a memory capacity of the non-volatile storage media 109.

In one embodiment, a local manager (not shown) of storage device 103 receives data access commands. A data access request (e.g., read, write) from the host 101 identifies an LBA address to read, write, or erase data from a memory unit identified by the LBA address. The local manager translates the logical address to a physical address.

In one embodiment, a controller is implemented by one or more processing devices. In one embodiment, a computer system includes a first memory device (e.g., SRAM) and a second memory device (e.g., a NAND flash storage device), and one or more processing devices (e.g., a CPU or system on a chip (SoC)). In one embodiment, the computer system can include a processing device and a controller.

The processing device can be, for example, a microprocessor, a central processing unit (CPU), a processing core of a processor, an execution unit, etc. In some instances, the controller can be referred to as a memory controller, a memory management unit, and/or an initiator. In one example, the controller controls the communications over a bus coupled between the computer system and one or more memory sub-systems.

The controller of the computer system can communicate with a controller of the memory sub-system to perform operations such as reading data, writing data, or erasing data at memory components and other such operations. In some instances, the controller is integrated within the same package of the processing device. In other instances, the controller is separate from the package of the processing device. The controller and/or the processing device can include hardware such as one or more integrated circuits and/or discrete components, a buffer memory, a cache memory, or a combination thereof. The controller and/or the processing device can be a microcontroller, special purpose logic circuitry (e.g., a field programmable gate array (FPGA), an application specific integrated circuit (ASIC), etc.), or another suitable processor.

In one embodiment, a computing system includes a memory system (e.g., storage device 103) and a host processor (e.g., host 101). In one embodiment, the memory system comprises a managed NAND flash device. In one embodiment, the memory system comprises a solid state drive (SSD).

A host interface (e.g., host interface 105) can be used to transfer data between the memory system and a host processor. The host interface can be in the form of a standardized interface. For example, when the memory system is used for data storage in a computing system, the host interface can be a serial advanced technology attachment (SATA), a serial attached SCSI (SAS), a peripheral component interconnect express (PCIe), or a universal serial bus (USB), among other connectors and interfaces. In general, however, the host interface can provide an interface for passing control, address, data, and other signals between the memory system and a host processor having compatible receptors for the interface. Host processor can be a host system such as a personal laptop computer, a desktop computer, a digital camera, a mobile telephone, or a memory card reader, among various other types of hosts. Host processor can include a system motherboard and/or backplane and can include a number of memory access devices (e.g., a number of processors). In some cases, the host processor can comprise a device configured to pre-program data within the memory system. However, the host processor may additionally comprise a device configured for reading data and writing data to the memory system after manufacturing.

The memory system receives commands and data from the host processor via the host interface which relays the commands and data to the controller. Data from the host comprises uncompressed data to write to the TLC region. This data may be streamed or transferred in bulk.

The controller can communicate with a non-volatile storage media to control data read, write, and erase operations, among other operations described herein. The controller can include, for example, a number of components in the form of hardware and/or firmware (e.g., one or more integrated circuits) and/or software for controlling access to the memory and/or for facilitating data transfer between the host processor and memory system.

In some embodiments, the controller includes a host I/O management component, a flash translation layer (FTL), and a memory unit management component.

In embodiments in which the memory (e.g., non-volatile storage media 109) includes a number of arrays of memory cells, the arrays can be flash arrays with a NAND architecture, for example. However, embodiments are not limited to a particular type of memory array or array architecture. The memory cells can be grouped, for instance, into a number of blocks, which are erased together as a group and can store a number of pages of data per block. A number of blocks can be included in a plane of memory cells and an array can include a number of planes. As used herein, a "page of data" refers to an amount of data that the controller is configured to write/read to/from the non-volatile storage media as part of a single write/read operation and can be referred to as a "flash page". As an example, a memory device may have a page size of 8 KB (kilobytes) and may be configured to store 128 pages of data per block, 2048 blocks per plane, and 16 planes per device.

In some embodiments, as mentioned above, non-volatile storage media 109 comprises two regions: TLC region 111 and SLC region 113. In some embodiments the SLC region is a pseudo-SLC region (pSLC) where TLC memory is configured to function and perform as SLC memory. Notably, the entire non-volatile storage media may be manufactured as TLC flash memory. That is, both regions 111 and 113 may comprise TLC NAND flash memory arrays. In some embodiments, these regions are fixed during manufacturing and addressed via firmware code that is configured to process read/write/erase commands based on the corresponding address in the non-volatile memory. In alternative embodiments, the pSLC region can be dynamically sized and resized. Since the pSLC region is, physically, the same as the TLC region, the resizing (or removing) of the pSLC region can be accomplished via firmware updates that allow utilization of all TLC data states in the pSLC region.

Unlike with traditional hard disk drives, data stored in flash arrays cannot be directly overwritten. That is, a block of flash cells must be erased prior to rewriting data thereto (e.g., a page at a time). In some embodiments, the controller can manage data transferred between the host processor and the flash arrays via a logical-to-physical mapping scheme. For instance, a flash translation layer can employ a logical addressing scheme (e.g., logical block addressing (LBA)). As an example, when new data received from the host processor is to replace older data already written to the flash array, the controller can write the new data in a new location on the non-volatile storage media and the logical-to-physical mapping of the FTL can be updated such that the corresponding logical address(es) associated with the new data being written indicates (e.g., points to) the new physical location. The old location, which no longer stores valid data, will be erased prior to being written again.

Flash memory cells can be cycled (e.g., programmed/erased) a limited number of times before they become unreliable. The controller can implement wear leveling to control the wear rate on the non-volatile storage media, which can reduce the number of program/erase cycles performed on a particular group (e.g., block) by spreading the cycles more evenly over the entire array. Wear leveling can include a technique called garbage collection, which can include reclaiming (e.g., erasing and making available for writing), blocks that have the greatest number of invalid pages. An invalid page can refer to a page containing invalid data (e.g., a page that no longer has an up-to-date mapping associated therewith). Alternatively, garbage collection can include reclaiming blocks with more than a threshold amount of invalid pages. If sufficient free blocks exist for a writing operation, then a garbage collection operation may not occur.

Write amplification may occur when writing data to non-volatile storage media. When randomly writing data to a memory array, the controller scans for available space in the array. Available space in a memory array can be individual cells, pages, and/or blocks of memory cells that are not storing data and/or have been erased. If there is enough available space to write the data in a selected location, then the data is written to the selected location of the memory array. If there is not enough available space in the selected location, the data in the memory array is rearranged by reading, copying, moving, or otherwise rewriting and erasing the data that is already present in the selected location to a new location, leaving available space for the new data that is to be written in the selected location. The relocation of valid data in the memory array is referred to as write amplification because the amount of data written to memory is greater than the amount of data that would occur if there were sufficient available space in the selected location (e.g., the physical amount of data is greater than the logical amount intended to be written). Write amplification is undesirable since it can consume bandwidth, which reduces performance, and can reduce the useful lifetime of an SSD. The amount of write amplification can be effected by various factors such as garbage collection efficiency, wear leveling efficiency, amount of random writes (e.g., writes to non-sequential logical addresses), and/or over-provisioning (e.g., the difference between the physical capacity of flash memory and the logical capacity presented through the operating system as available to the user), among other factors.

The flash translation layer can, in collaboration with a host I/O management component (not shown) and a mapping unit management component (not shown), perform address mapping. In some embodiments, the host I/O management component manages data received in association with write commands from the host processor (e.g., prior to mapping via the FTL). The I/O workload of the host processor can be irregular and/or variable. For instance, large file writes (e.g., writes corresponding to a large amount of data) can often be mixed with small writes (e.g., writes corresponding to a small amount of data). In this context, "large" and "small" refer only to a relative difference in size. As an example, a small write may refer to writing of 4 KB of metadata. A large file write may include writing of 128 KB of data, for instance. A large file write may comprise a number of consecutive large file writes. For instance, writing of a 2 GB video file may comprise a number of consecutive 128 KB write commands from the host processor.

In one embodiment, a controller (e.g., controller 107) includes firmware, which controls the operation of the memory system as described above. Additionally, the firmware implements a codec that performs the compression and decompression routines described above. In one example, this compressed data is stored in the SLC mode in SLC region 113. The controller is further modified to monitor one or more temperatures. In response to detecting a high temperature from this monitoring, the controller compresses the data from the TLC region (e.g., TLC region 111). The compressed data is then written to the SLC region (e.g., SLC region 113).

Figure 2:
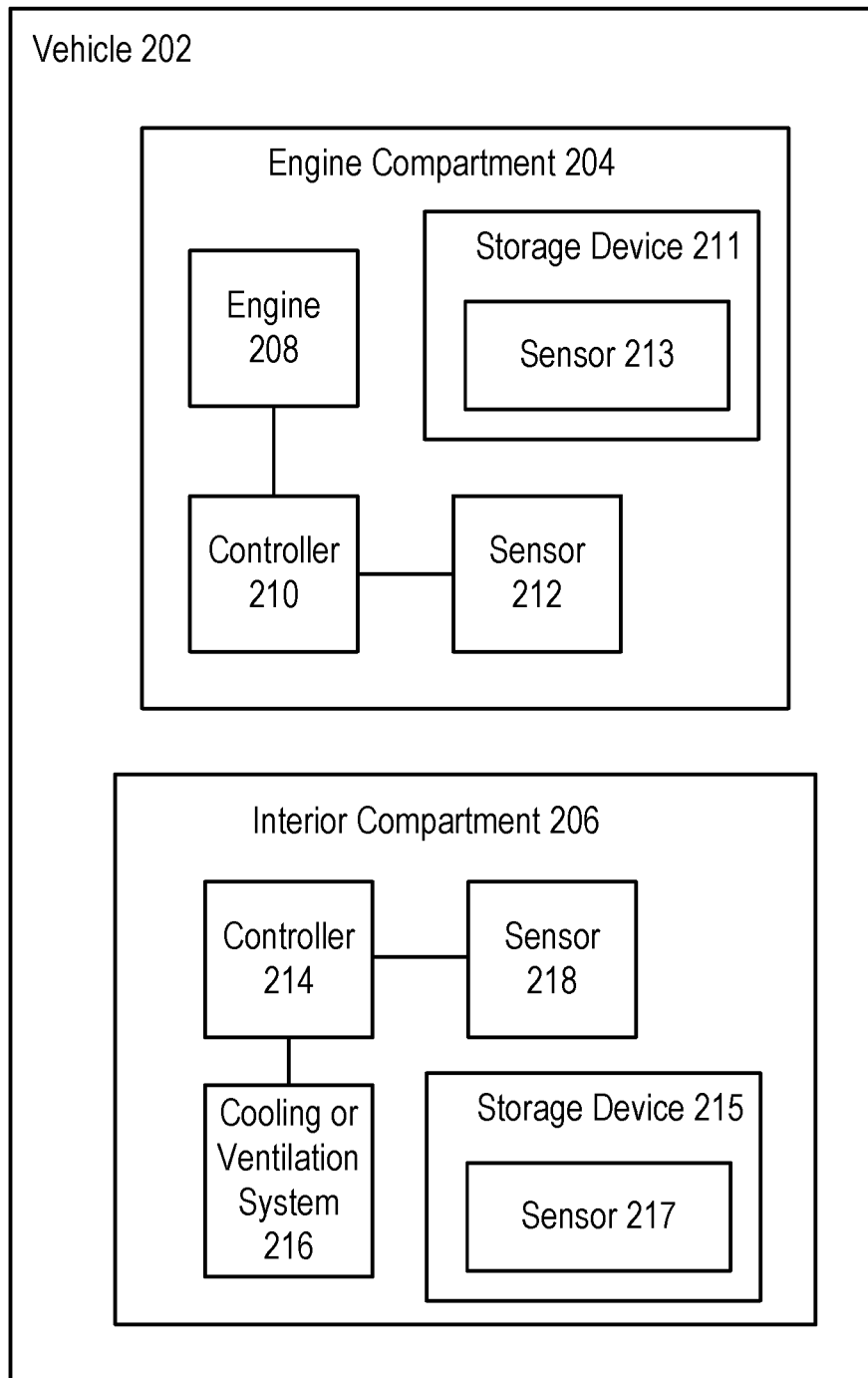
FIG. 2 illustrates a vehicle including a storage device mounted in an engine compartment of the vehicle, and a storage device mounted in an interior compartment of the vehicle, in accordance with some embodiments.

FIG. 2 illustrates a vehicle 202 including a storage device 211 mounted in an engine compartment 204 of the vehicle 202, and a storage device 215 mounted in an interior compartment 206 of vehicle 202, in accordance with some embodiments. Storage device 211 and storage device 215 are examples of storage device 103 of FIG.

In one example, vehicle 202 is powered by a gasoline-fueled engine 208. In alternative embodiments, vehicle 202 can be an electric-powered vehicle that is powered using a storage battery (not shown) of vehicle 202.

A controller 210 is mounted in engine compartment 204. Controller 210 controls the operation of an engine 208 that is mounted in engine compartment 204. Controller 210 receives sensor data collected by a sensor 212 mounted in engine compartment 204. Sensor 212 is an example of sensor 117 of FIG. 1. In one example, engine 208, controller 210, and sensor 212 are mounted underneath a front or rear hood of vehicle 202.

In one embodiment, sensor 212 detects an ambient temperature within the engine compartment 204. In one example, sensor 212 detects a temperature of a surface of storage device 211. In one example, the surface is an external surface of packaging or another physical enclosure of storage device 211. In one example, sensor 212 is included in an integrated circuit or chip mounted on a circuit board along with the storage device 211.

In one embodiment, during operation, controller 210 controls the manner of storage of data in storage device 211 based on sensor data received from sensor 212. In one embodiment, controller 210 further controls the operation of engine 208 based on the sensor data received from sensor 212.

A sensor 213 of storage device 211 collects sensor data regarding a temperature associated with storage device 211. Sensor 213 is an example of sensor 115 of FIG. 1.

In one embodiment, controller 210 controls a manner of storage in storage device 211 based on sensor data received from sensor 212 and/or sensor 213. In one embodiment, a controller (not shown) of storage device 211 controls the manner of storage of data in storage device 211 based on temperature data collected by sensor 213.

In one embodiment, storage device 211 controls the manner of storage independently from controller 210. In one example, storage device 211 sends a signal to controller 210 indicating a change has been made and/or will be made in the manner of storage of data in storage device 211. In one embodiment, in response to receiving the signal, controller 210 changes a configuration of sensor 212 regarding a type or manner of data to be collected by sensor 212. In one embodiment, controller 210 changes a mode of operation of engine 208 from a normal mode to a conservative mode (e.g., a mode that requires less intensive data processing bandwidth, lower power, and/or data processing resources)

in response to determining that a change has been made in the manner of storage of data in storage device 211.

A controller 214 and sensor 218 are each mounted in interior compartment 206. Controller 214 receives sensor data collected by sensor 218. In one example, the sensor data is temperature data. In one example, the temperature data is for an ambient temperature of interior compartment 206.

Storage device 215 is controlled, at least in part, based on signals received from controller 214. In one embodiment, controller 214 causes a change in a manner of storage of data in storage device 215 based on temperature data collected from sensor 218. In one embodiment, controller 214 changes the operation of cooling or ventilation system 216 in order to lower an operating temperature of storage device 215. In one example, cooling or ventilation system 216 provides cooled air and/or an airflow to interior compartment 206. In one example, storage device 215 and sensor 218 are mounted under the dash of a vehicle.

In one embodiment, storage device 215 includes a sensor 217. Sensor 217 collects temperature data associated with storage device 215. In one example, sensor 217 collects data indicating a temperature of a non-volatile storage media of storage device 215.

In one embodiment, controllers 210 and 214 share sensor data that has been collected. In one example, controller 214 adjusts a manner of storage of data in storage device 215 based at least in part on sensor data collected by sensor 212 and/or sensor 213.

Figure 3:
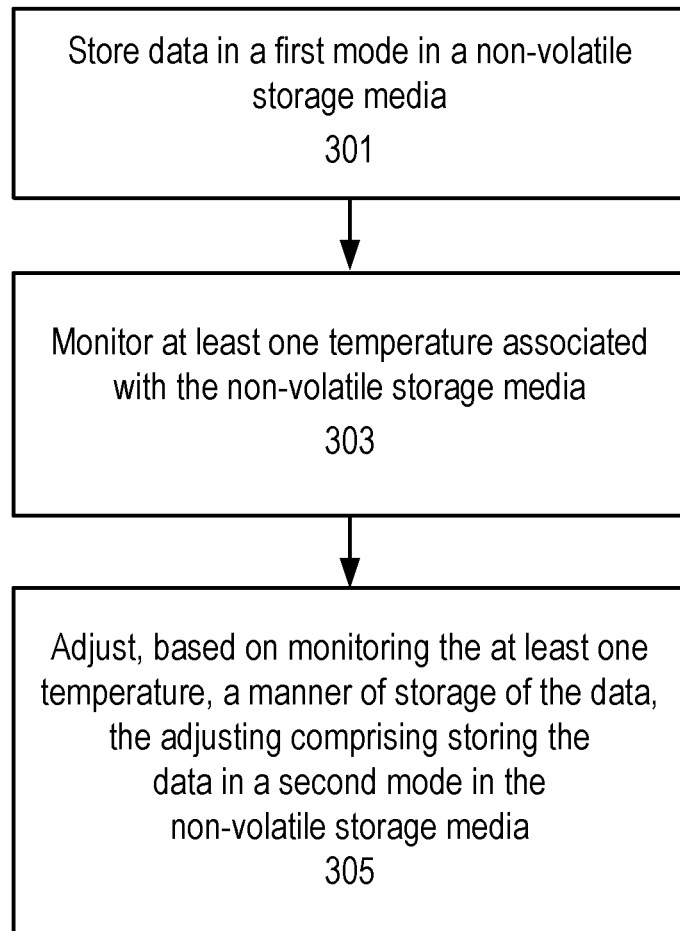
FIG. 3 shows a method for adjusting a manner of storage of data based on monitoring one or more temperatures, in accordance with some embodiments.

FIG. 3 shows a method for adjusting a manner of storage of data based on monitoring one or more temperatures, in accordance with some embodiments. For example, the method of FIG. 3 can be implemented in the system of FIG. 1. In one example, the manner of storage of data in storage device 103 of FIG. 1 is adjusted.

The method of FIG. 3 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 3 is performed at least in part by one or more processing devices (e.g., controller 107 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 301, data is stored in a first mode in a non-volatile storage media. In one example, data is stored by controller 107 in non-volatile storage media 109.

At block 303, one or more temperatures associated with the non-volatile storage media are monitored. In one example, a temperature of non-volatile storage media 109 is determined using sensor 115. In one example, an ambient temperature of storage device 103 is determined using sensor 117.

At block 305, based on monitoring the one or more temperatures, a manner of storage of the data is adjusted. The adjusting comprises storing the data in a second mode in the non-volatile storage media. In one example, data stored in TLC region 111 is compressed and copied to SLC region 113.

In one embodiment, a method for a storage device (e.g., storage device 103) comprises: storing, by the storage device, first data in a first mode (e.g., a TLC mode) in a non-volatile storage media (e.g., non-volatile storage media 109); monitoring at least one temperature associated with the non-volatile storage media; and adjusting, based on monitoring the at least one temperature, a manner of storage of the first data. The adjusting comprises: compressing the first data to provide compressed data, and storing the compressed data in a second mode (e.g., an SLC mode) in the non-volatile storage media, wherein the first mode has a storage density greater than the second mode.

In one embodiment, the monitoring comprises collecting sensor data from at least one sensor (e.g., sensor 115 and/or sensor 117).

In one embodiment, the at least one sensor comprises a first sensor located in the storage device (e.g., sensor 115) to detect a first temperature of the non-volatile storage media, and a second sensor (e.g., sensor 117, sensor 212, and/or sensor 218) mounted externally to the storage device, the second sensor configured to detect a second temperature of an atmosphere (e.g., ambient air surrounding the storage device) external to the storage device.

In one embodiment, the storage device and the second sensor are each mounted inside an engine compartment of a vehicle (e.g., vehicle 202), and wherein the compartment includes an engine that provides power to the vehicle.

In one embodiment, the method further comprises: determining that a first temperature of the non-volatile storage media is less than a predetermined threshold (e.g., a predetermined temperature that corresponds to an increased risk of data loss due to high-temperature); in response to determining that the first temperature is less than the predetermined threshold, decompressing the stored compressed data to provide decompressed data; and storing the decompressed data in the first mode in the non-volatile storage media.

In one embodiment, monitoring the at least one temperature comprises determining that a first temperature of the non-volatile storage media is greater than a predetermined threshold. The method further comprises: in response to determining that the first temperature is greater than the predetermined threshold, adjusting operation of a cooling or ventilation system (e.g., cooling or ventilation system 119) of a vehicle to lower an ambient temperature of the storage device.

In one embodiment, monitoring the at least one temperature comprises determining, based on collected sensor data, that a first temperature of the non-volatile storage media is greater than a predetermined threshold; compressing the first data includes copying the first data from a first region of the non-volatile storage media, the first region operating in the first mode; and the compressed data is stored in a second region of the non-volatile storage media, the second region operating in the second mode.

In one embodiment, monitoring the at least one temperature comprises: predicting a future temperature; and determining that the future temperature will exceed a predetermined threshold.

In one embodiment, the future temperature is a temperature of the storage device, or an ambient temperature of the storage device.

In one embodiment, the method further comprises: for each of a plurality of data portions stored in the non-volatile storage media, storing a respective data type corresponding to the stored data portion; and determining, based on the stored data types, a first data type corresponding to the first data. Adjusting the manner of storage is further based on the determined first data type. In one example, a first data type corresponds to data used to navigate vehicle 202. In one example, another data type includes data that is less critical to real-time operation, such as data that is not used to navigate a vehicle.

In one embodiment, the storage device stores data used in operating a vehicle, and monitoring the at least one temperature is performed by at least one of the storage device, or a controller (e.g., controller 210 or controller 214) of a computing system of the vehicle.

In one embodiment, the first mode is a multi-level cell (MLC) mode, a triple-level cell (TLC) mode, or a quad-level cell (QLC) mode, and wherein the second mode is a single-level cell (SLC) mode.

In one embodiment, a non-transitory computer storage medium stores instructions which, when executed on a computing device, cause the computing device to at least: store first data in a first mode in a non-volatile storage media; monitor at least one temperature associated with the non-volatile storage media; and adjust, based on monitoring the at least one temperature, a manner of storage of the first data, the adjusting comprising storing the first data in a second mode in the non-volatile storage media.

In one embodiment, the first mode has a storage density greater than the second mode.

In one embodiment, the instructions further cause the computing device to compress the first data to provide compressed data. Storing the first data in the second mode comprises storing the compressed data.

In one embodiment, a system comprises: a storage device configured to store data in a non-volatile storage media using either a first mode or a second mode, wherein the first mode has a storage density greater than the second mode; at least one sensor; at least one processing device; and memory containing instructions configured to instruct the at least one processing device to: store first data in the first mode in the non-volatile storage media; monitor, using the at least one sensor to collect sensor data, at least one temperature associated with the non-volatile storage media; and adjust, based on the collected sensor data, a manner of storage of the first data. The adjusting comprises compressing the first data to provide compressed data, and storing the compressed data in the second mode in the non-volatile storage media.

In one embodiment, the non-volatile storage media comprises a first region (e.g., TLC region 111) and a second region (e.g., SLC region 113), the first region operating in the first mode (e.g., TLC mode), and the second region operating in the second mode (e.g., SLC mode).

In one embodiment, the at least one sensor comprises a first sensor located in the storage device to detect a temperature of the non-volatile storage media.

In one embodiment, the at least one sensor comprises a first sensor mounted externally to the storage device, the first sensor configured to detect a temperature of an atmosphere external to the storage device.

In one embodiment, the system further comprises a cooling or ventilation system of a vehicle. Monitoring the at least one temperature comprises determining that a first temperature of the non-volatile storage media is greater than a predetermined threshold. The instructions are further configured to instruct the at least one processing device to, in response to determining that the first temperature is greater than the predetermined threshold, adjust operation of the cooling or ventilation system to lower an ambient temperature of the storage device.

In one example, a method stores data into a TLC region of a NAND flash array. The method monitors at least one temperature associated with the non-volatile storage media that includes the TLC region and a pSLC region. The method writes TLC data to the pSLC region of the NAND flash array based on monitoring the at least one temperature.

In one embodiment, the method may designate part of the TLC region to operate as pSLC NAND flash memory. Since pSLC utilizes the underlying TLC architecture, the method may modify the firmware to enable pSLC access to the pSLC region. This effectively converts part of the TLC region into a pSLC region. In some embodiments, the method may copy part or all of the TLC data into cache memory prior to designating part of the TLC region to operate as pSLC NAND flash memory.

In one embodiment, a set of addresses of a NAND flash array may be designated as a pSLC region. For example, the first N addresses of the array may be designated as the pSLC region. Designating a pSLC region comprises configuring firmware to only write one bit per cell in the pSLC region. In one embodiment, the method accesses the pSLC region simply by writing to the addresses. In other embodiments, a NAND array controller provides commands for accessing the pSLC region. In one embodiment, the method sequentially writes compressed data to the pSLC region (e.g., starting at address zero).

In some embodiments, data in a TLC region is compressed prior to being written into a pSLC region. In one embodiment, this algorithm is executed by a codec represented in the memory device's firmware/controller. Alternatively, the codec can be situated external to the device.

In one embodiment, the stored data is compressed using a lossless compression algorithm. In one example, data from TLC region 111 is compressed prior to being written to pSLC region 113. In one embodiment, this compression may be performed by a controller of the memory device itself (received via a host interface, JTAG, etc.). Various lossless compression algorithms may be used such as run-length encodings (RLE), bzip2, Lempel-Ziv compression (and variants thereof), etc. Alternatively, or in conjunction with the foregoing, application-specific compression algorithms may be used based on the data to be written. For example, Free Lossless Audio Codec (FLAC) may be used for audio data or H.264 lossless compression may be used for video data. The specific type of lossless compression algorithm used is not limiting.

In some embodiments, prior to writing, the method confirms whether the size of the compressed data will fit within the pSLC region. If so, the method continues to write the complete compressed data into the pSLC region. If not, the method may selectively compress a portion of the data in the TLC region and write the compressed data to the pSLC region of the NAND flash array. In some embodiments, the method may segment uncompressed data into bits and pad each bit with two zeros to simulate pSLC operations in the TLC operation. In some embodiments, the method may distribute data in the pSLC region such that data is not written to consecutive cells.

In one embodiment, a method may copy the contents of the TLC region to cache memory such as onboard dynamic random-access memory (DRAM) or static random-access memory (SRAM) that is installed as part of the memory device (e.g., in an SSD or similar device). In some embodiments, the method copies the entire contents of the TLC region to cache memory for processing. In other embodiments, the method may stream data from the TLC region for processing, reducing SRAM/DRAM usage. In some embodiments, the SRAM/DRAM will be sized to accommodate the TLC region and thus the entire contents of the TLC can be copied to the cache.

In some embodiments, the method may write the compressed data starting at the first pSLC address. The method may write the data sequentially as it is encoded from the start of the pSLC region. In other embodiments, the compressed data may include indications of addresses in which the data should be written into the pSLC region.

In an alternative embodiment, the method may compress the TLC data and store the data within the cache until all TLC data is compressed. The method may then perform a bulk write of the compressed data to the pSLC region.

In some embodiments, the method checks to determine if all the data in the TLC region has been compressed and copied to the pSLC region. If not, the method continues to compress any remaining data in the TLC region and write the data to the pSLC region.

In some embodiments, the method performs error code correction (ECC) on the compressed data. In some embodiments, the method may perform ECC prior to compressing as well. Embodiments are not limited on the specific type of ECC employed and, in some embodiments, the method may utilize the ECC installed within the memory device and used during normal operations.

In one embodiment, the method updates the controller firmware to enable pSLC operation of the pSLC region.

In some embodiments, the pSLC region is retained throughout the life of the device. In these embodiments, the compressed data may be retained in the pSLC region.

In some embodiments, the method enables access to the TLC and pSLC regions for a host processor. In some embodiments, the method may deny access to the flash array while data is being compressed and written to the pSLC region. After completion of the process, the method may enable read/write/erase and other operations on the NAND flash array in accordance with standard interfaces.

Various embodiments related to controlling a storage density for stored data based on temperature are now described below. The generality of the following description is not limited by the various embodiments described above.

In some prior approaches, memories are pre-programmed with data prior to installation in, for example, chipsets and circuit boards. This pre-programmed data may comprise bootstrap code, bootloader code, operating system (OS) code, file system data, and other operational data used by a memory system. To reduce costs and complexity during manufacturing, this data is often pre-programmed into the memory device during bulk manufacturing. Thus, batches of memory devices are pre-programmed simultaneously prior to downstream usage of the devices.

In existing systems, this data is not compressed, but is rather copied, uncompressed, as the data will be used by downstream applications. During manufacture, memories undergo various manufacturing operations (e.g., reflow soldering to affix the memories to printed circuit boards (PCBs) or other backplanes) that cause elevated temperature exposure. For example, as part of a reflow soldering process, memories are exposed to high temperatures. For TLC (and MLC or QLC) memories, the threshold voltages of the multi-level cells are shifted, which causes the technical problem of data corruption after the heating is completed. Thus, the pre-programmed data is corrupted when the memories are attached to, for example, final PCBs (e.g., for shipping to an end user).

During manufacturing, a memory system may also be subjected to higher temperatures in other processing steps. For example, the memory system may be subjected to a burn-in processing step. These other steps can lead to data corruption.

Various embodiments described below provide a technological solution to one or more of the above technical problems. In one embodiment, a method includes: loading software into a non-volatile memory of a storage device while a temperature of the non-volatile memory is less than a predetermined threshold (e.g., a temperature less than 60 degrees Celsius); storing the software in a compressed format in a first mode (e.g., an SLC mode) in the non-volatile memory; exposing, during a manufacturing operation (e.g., a reflow soldering or burn-in manufacturing step) associated with the storage device and while the software is stored in the first mode, the non-volatile memory to a temperature greater than the predetermined threshold (e.g., exposing to the burn-in step); and determining that the temperature of the non-volatile memory has fallen below the predetermined threshold (e.g., after the burn-in is completed). In response to determining that the temperature of the non-volatile memory has fallen below the predetermined threshold, the stored software is decompressed. The decompressed software is stored in a second mode (e.g., a TLC mode) in the non-volatile memory. The second mode has a storage density higher than the first mode.

In one embodiment, a compressed version of software (e.g., firmware) is initially stored in a compressed and/or encrypted format in an SLC mode in a NAND flash memory system. In one example, a software tool is used to collect software such as firmware or an application, and then compress and/or encrypt the software for the initial storing/installation in the SLC mode.

Subsequently, during the testing, break-in, storage, and/or transportation of a product that includes the flash memory, the memory system is turned on (e.g., activated for initial or set-up operation) to expand the firmware/software into an uncompressed version and/or decrypted format in, for example, a TLC mode.

In one example, when data is stored in an SLC mode in NAND flash memory, elevated heat exposure generally does not corrupt the data pre-programmed in the gates of the memory. Thus, when the NAND flash memory is exposed to high temperature during the manufacturing process, the stored data survives the high temperature because the data has been stored in the SLC mode.

In addition, although the SLC mode has a lower storage density, storing the data in a compressed format permits storing a greater quantity of data in the SLC mode. Also, when loading data to the flash memory, writing the compressed data takes less time than writing uncompressed data. For example, this can increase throughput in a memory production process in which programmed data is stored in a memory before assembly of the memory into a vehicle or other device.

After the manufacturing process at the elevated temperature is completed, and the temperature of the non-volatile memory has fallen below a predetermined threshold, the compressed data stored in the SLC mode can be decompressed and stored in, for example, a TLC mode.

In one example, the decompression and storing in the TLC mode above is done during and/or in response to detection of various events. In one example, the event is testing, break-in, storage, and/or transportation of the vehicle or device. In this manner, the decompression and/or storing in the TLC mode can be performed during an idle time in the overall manufacturing process so that there is reduced or no adverse impact on throughput or productivity.

In one embodiment, the event is detected based on one or more sensors of the non-volatile memory and/or other sensors (e.g., sensors that monitor a manufacturing or storage environment and/or sensors of a device being manufactured or stored).

In one embodiment, firmware for a solid-state drive (SSD) is loaded and stored in a compressed format in an SLC mode (e.g., prior to a burn-in step). The SSD cannot yet function in a "production" mode (e.g., the end user cannot use the SSD in its end user mode; and the SSD is not user-ready). The installation process is completed when the SSD firmware is uncompressed and installed in the TLC mode. Then, the SSD is in a configuration suitable for normal operation by an end user.

In one example, software is loaded and stored in the SLC mode in a flash memory at room temperature (e.g., less than 23-27 degrees Celsius). The flash memory is part of a solid state drive that will be mounted in a vehicle. The solid-state drive is next mounted in a vehicle at room temperature (e.g., at a time when the flash memory in the vehicle is at a temperature that is below a first predetermined threshold). Next, as part of the manufacturing process, the vehicle is exposed to an elevated temperature (e.g., a temperature that is above the first predetermined threshold, or above a second predetermined threshold). Then, the vehicle is returned to an environment in which the temperature is below the first predetermined threshold or the second predetermined threshold. At this time, the software is decompressed and stored in a TLC mode (or a MLC or QLC mode). Finally, testing is performed to confirm proper operation of the solid-state drive in a normal mode suitable for end user operation.

In one embodiment, during a manufacturing process: in a first stage, a program running on a computing device (e.g., a server) in a factory installs the compressed software in the memory in SLC mode in a way that is "bootable" for decompressing itself (e.g., to a TLC mode) at a later second stage. In the second stage, the self-installing, bootable, compressed software re-installs itself in the memory to make the final product suitable for end user operation (e.g., in a way similar to a firmware upgrade in which old firmware installs new firmware to replace itself).

In one embodiment, compressed data is generated by compressing raw data for storage in a memory device (e.g., a flash memory storage device), pre-programming a first region (e.g., an SLC region) of the memory device with the compressed data, and, based on monitoring a temperature associated with the memory device (e.g., in response to detecting a temperature falling below a predetermined limit), decompressing the compressed data, obtaining the raw data, and transferring the raw data to a second region (e.g., a TLC region) of the memory device.

In one embodiment, the SLC region is formed using SLC devices. The TLC region is formed using TLC devices. In one example, the SLC region is on a different chip than the TLC region.

Figure 4:
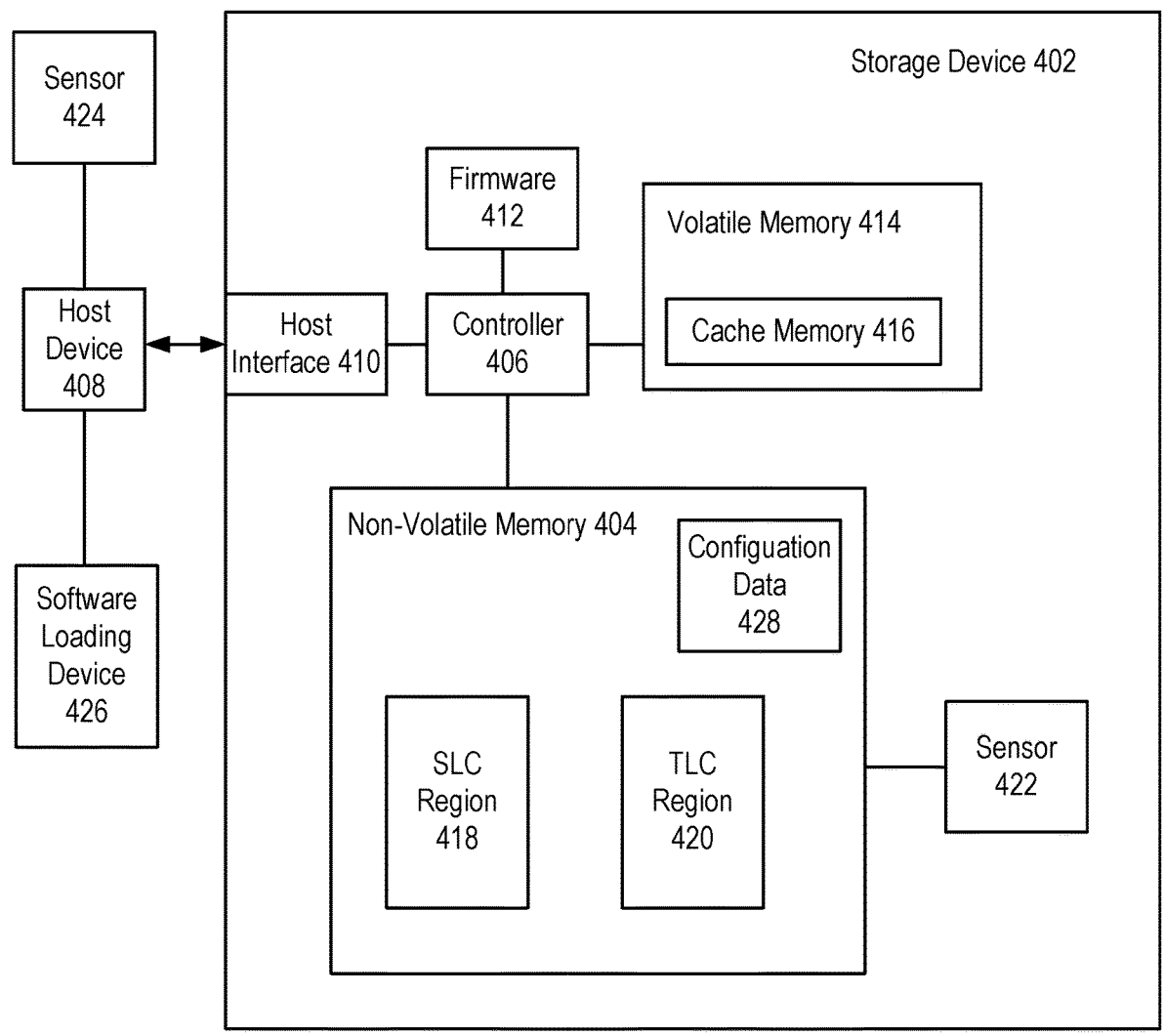
FIG. 4 illustrates a storage device including a sensor to monitor a temperature associated with a non-volatile memory, in accordance with some embodiments.

FIG. 4 illustrates a storage device 402 including one or more sensors (e.g., sensor 422 and/or sensor 424) to monitor a temperature associated with a non-volatile memory 404, in accordance with some embodiments. In one example, storage device 103 can be used to implement storage device 402. In one example, host 101 can be used as host device 408.

Storage device 402 stores data in the non-volatile memory 404. The non-volatile memory 404 stores data using a first mode (e.g., SLC) and a second mode (e.g., TLC or QLC). Data is stored in the first mode in an SLC region 418 and in the second mode in a TLC region 420. The second mode has a higher memory density (e.g., storing two or more bits per cell) than the first mode (e.g., storing one bit per cell). Information regarding how the non-volatile memory 404 is configured is stored in configuration data 428 within the non-volatile memory 404.

In one embodiment, the non-volatile memory 404 is configured so that the SLC region 418 is provided by a portion of the TLC region 420 that functions as pSLC flash memory. The remainder of the TLC region 420 operates as TLC flash memory. In some embodiments, the TLC region 420 and SLC region 418 (e.g., pSLC) are fixed during manufacturing and addressed via firmware code that configures read/write/erase commands based on the corresponding address in the array. In alternative embodiments, the SLC region 418 can be dynamically sized and resized. Since the SLC region 418, when configured as pSLC memory, is physically the same as TLC region 420, resizing (or removing) the SLC region 418 can be accomplished via firmware updates that allow storing the same number of bits per cell as the TLC region 420.

As mentioned above, storage device 402 includes at least one sensor (e.g., sensor 422). In one example, sensor 422 measures the temperature of the non-volatile memory 404. In one example, sensor 424 measures temperature external to storage device 402.

Storage device 402 includes at least one processing device (e.g., controller 406). In one example, controller 406 is a microcontroller. The controller 406 receives commands (e.g. read/write/erase) from a host interface 410. The controller 406 is connected to the non-volatile memory 404 and a volatile memory 414. In one embodiment, the controller 406 includes firmware 412 which controls the operation of the storage device 402.

The controller 406 executes instructions stored in memory (e.g., firmware 412). In one example, the instructions are stored in a memory device external to controller 406 (e.g., a flash memory device). In one example, the memory is contained internally within controller 406.

Controller 406 loads data into the non-volatile memory 404. In one example, the data is software. In one example, controller 406 receives software written by host device 408 through the host interface 410. In one example, the host device 408 takes software from a software loading device 426 and routes the software to host interface 410. In one example, firmware 412 handles all commands received via the host interface 410. In one example, software or other data received from the host device 408 comprises uncompressed data to write to the SLC region 418. Data from the host device 408 may be streamed or transferred in bulk. Controller 406 writes the software into non-volatile memory 404 (e.g., into SLC region 418). In one example, controller 406 writes software into the SLC region 418 when the temperature of the non-volatile memory 404 (e.g., based on a temperature measured by sensor 422) is below a predetermined threshold (e.g., 60 degrees Celsius).

Controller 406 loads the software into the non-volatile memory 404 in the first mode in a compressed form. In one embodiment, this compression may be performed offline or by an external device. In other embodiments, it may be performed by a controller of the memory device itself (e.g., controller 406 using data received via the host interface 410, JTAG, etc.). In one embodiment, firmware 412 implements a codec that performs the compression and decompression routines. Various lossless compression algorithms may be used such as run-length encodings (RLE), bzip2, Lempel-Ziv compression (and variants thereof), etc. Alternatively, or in conjunction with the foregoing, application-specific compression algorithms may be used based on the data to be written. For example, Free Lossless Audio Codec (FLAC) may be used for audio data or H.264 lossless compression may be used for video data.

In one embodiment, a controller is modified to include a codec which can be used to compress data prior to manufacturing. In one embodiment, this compressed data is pre-programmed into the SLC region 418 of non-volatile memory 404.

After the software has been stored in the first mode, the non-volatile memory 404 is exposed to a temperature exceeding the predetermined threshold (e.g., 60 degrees Celsius). For example, manufacturing operations such as soldering or system burn-in may cause the temperature of the non-volatile memory 404 (e.g., based on a temperature measured by sensor 422) to exceed a predetermined threshold. In one example, the software is stored in the first mode when the non-volatile memory 404 is at room temperature. As a next step, the storage device 402 is exposed to a burn-in temperature for a predetermined time period (e.g., more than 5 minutes).

Later, controller 406 determines that the temperature of the non-volatile memory 404 (e.g., based on a temperature measured by sensor 422) has fallen below a predetermined threshold (e.g., a temperature in the range of 40-80 degrees Celsius). For example, the temperature of the non-volatile memory 404 may fall below the predetermined threshold following completion of soldering or system burn-in operations.

In response to determining that the temperature of the non-volatile memory 404 has fallen below a predetermined threshold (e.g., 60 degrees Celsius), the software is decompressed and stored in the second mode (e.g., TLC or QLC mode) in the non-volatile memory 404. In one example, the software is decompressed using a lossless decompression algorithm. In one embodiment, this decompression may be performed offline or by an external device. In other embodiments, it may be performed by a controller of the memory device itself (e.g., controller 406). In one embodiment, the software is copied into a cache memory 416 (e.g., within the volatile memory 414) for controller 406 to perform the software decompression.

In one embodiment, after the temperature of the non-volatile memory 404 (e.g., based on a temperature measured by sensor 422) exceeds a predetermined threshold (e.g., 60 degrees Celsius, or another temperature selected from the range of 30-85 degrees Celsius), a flag is set (e.g., in configuration data 428). After a temperature of the non-volatile memory 404 falls below a predetermined threshold (e.g., 60 degrees Celsius, or another temperature selected from the range of 30-85 degrees Celsius), another flag is set. In one embodiment, firmware (e.g., firmware 412) monitors the state of these flags. After both flags have been set, the firmware triggers a transfer operation to be executed (e.g., by controller 406). During transfer, access to the non-volatile memory 404 is blocked (e.g., by controller 406), compressed data is read out of the SLC region 418, decompressed, and transferred as uncompressed data into the TLC region 420. This operation ensures that data pre-programmed in the SLC region 418 is not corrupted during manufacturing (e.g., reflow soldering) while ensuring that the capacity of TLC region 420 is exploited during use.

Figure 5:
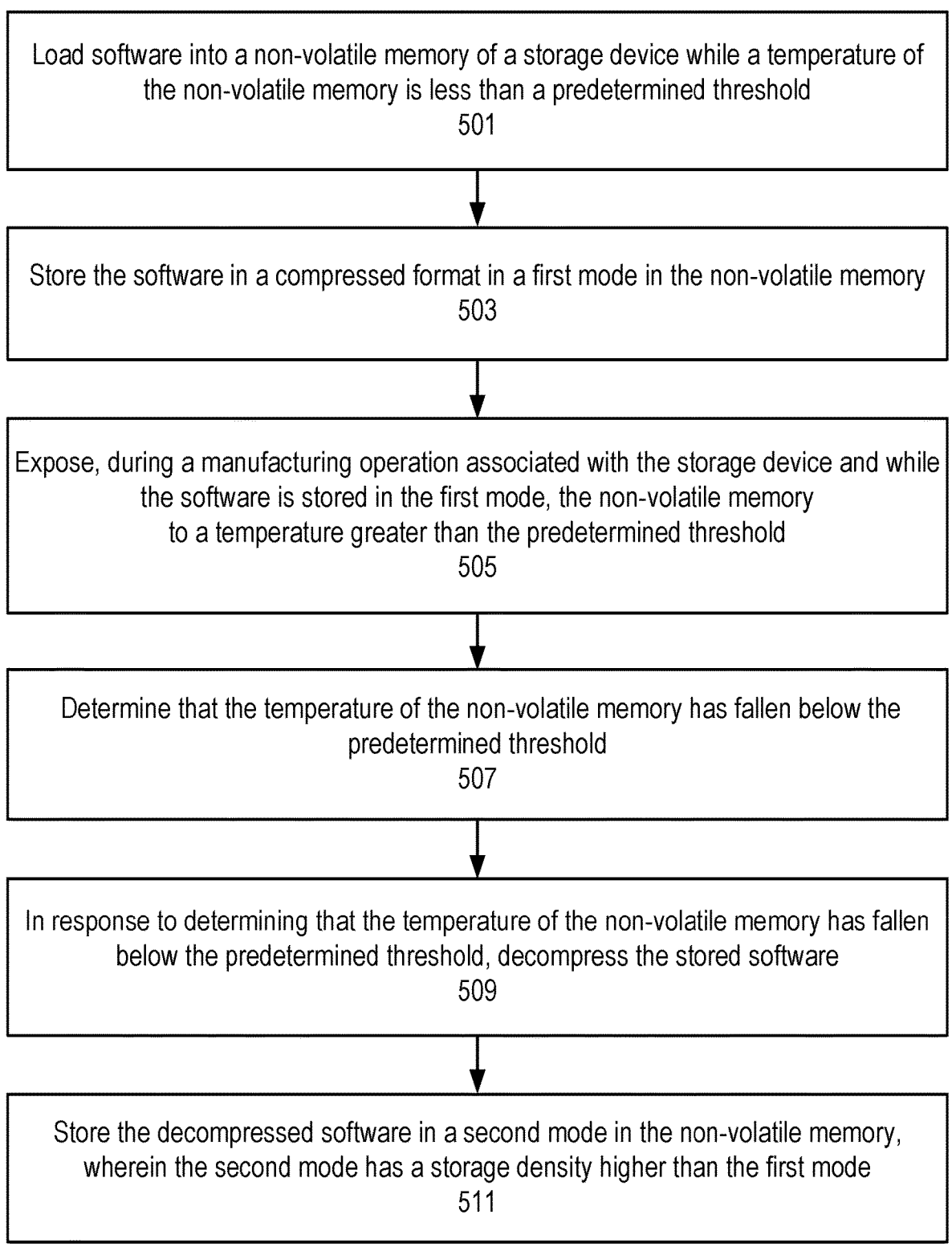
FIG. 5 shows a method for controlling a storage density for data stored in a storage device based on monitoring a temperature, in accordance with some embodiments.

FIG. 5 shows a method for controlling a storage density for data stored in a storage device based on monitoring a temperature, in accordance with some embodiments. For example, the method of FIG. 5 can be implemented in the system of FIG. 4. In one example, the storage device is storage device 402 of FIG. 4.

The method of FIG. 5 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 5 is performed at least in part by one or more processing devices (e.g., controller 406 of FIG. 4).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 501, software is loaded into a non-volatile memory of storage device while the temperature of the non-volatile memory is less than a predetermined threshold. In one example, the non-volatile memory is non-volatile memory 404.

At block 503, the software is stored in the non-volatile memory in a compressed format using a first mode. In one example, the first mode is an SLC mode.

At block 505, the non-volatile memory is exposed to a temperature greater than the predetermined threshold. This exposure occurs during a manufacturing operation associated with the storage device. This exposure occurs while the software is being stored in the first mode. In one example, the predetermined threshold is a temperature corresponding to a manufacturing operation. In one example, the predetermined threshold is a temperature corresponding to the start or completion of the manufacturing operation. In one example, the predetermined threshold is a temperature that corresponds to an increased risk of data loss for data stored in the non-volatile memory.

At block 507, it is determined that the temperature of the non-volatile memory has fallen below the predetermined threshold.

At block 509, in response to determining that the temperature of the non-volatile memory has fallen below predetermined threshold, the stored software is decompressed. In one example, the software is decompressed by controller 406.

At block 511, the decompressed software is stored in a second mode in the non-volatile memory. The second mode has a storage density higher than the first mode. In one example, the second mode is a TLC or QLC mode.

In one embodiment, a method comprises: loading software into a non-volatile memory of a storage device (e.g., storage device 402) while a temperature of the non-volatile memory is less than a predetermined threshold; storing the software in a compressed format in a first mode in the non-volatile memory; exposing, during a manufacturing operation associated with the storage device and while the software is stored in the first mode, the non-volatile memory to a temperature greater than the predetermined threshold; and determining that the temperature of the non-volatile memory has fallen below the predetermined threshold. In response to determining that the temperature of the non-volatile memory has fallen below the predetermined threshold, the following steps are performed: decompressing the stored software, and storing the decompressed software in a second mode in the non-volatile memory, wherein the second mode (e.g., a TLC mode) has a storage density higher than the first mode (e.g., an SLC mode).

In one embodiment, the method further comprises: prior to loading the software, collecting, by a software tool, the software; and compressing the collected software into the compressed format. In one example, the software tool is a software program used to load pre-programmed software into flash memory. In one example, the software tool executes on software loading device 426.

In one embodiment, the collected software is compressed using lossless compression.

In one embodiment, the non-volatile memory is NAND flash memory.

In one embodiment, the non-volatile memory comprises a first region (e.g., SLC region 418) and a second region (e.g., TLC region 420), the software is stored in the first mode in the first region, and the software is stored in the second mode in the second region.

In one embodiment, the method further comprises, after storing the decompressed software in the second mode in the non-volatile memory, resizing or removing the first region.

In one embodiment, the method further comprises, after storing the decompressed software in the second mode in the non-volatile memory, converting the first region to operate in the second mode.

In one embodiment, the first region is configured to operate as a pseudo single-level cell (pSLC) NAND flash region.

In one embodiment, the non-volatile memory is flash memory, the first region is operated in the first mode by a controller (e.g., controller 406) that controls storage of data in the flash memory, and the second region is operated in the second mode by the controller.

In one embodiment, the software is firmware (e.g., firmware 412) for the storage device, and the firmware controls read and write operations for data stored in the non-volatile memory.

In one embodiment, the software is firmware or an application.

In one embodiment, the software stored in the first mode is encrypted.

In one embodiment, the method further comprises: reading the software stored in the first mode from the non-volatile memory; and decrypting the software read from the non-volatile memory to provide decrypted software; wherein the software stored in the second mode is the decrypted software.

In one embodiment, the non-volatile memory stores data for an autonomous vehicle in response to commands received from a controller of the autonomous vehicle, and determining that the temperature of the non-volatile memory has fallen below the predetermined threshold comprises: collecting, by the controller, sensor data using at least one sensor (e.g., sensors 422 and/or 424) of the autonomous vehicle; wherein determining that the temperature of the non-volatile memory has fallen below the predetermined threshold is based on the collected sensor data.

In one embodiment, determining that the temperature of the non-volatile memory has fallen below the predetermined threshold comprises: reading stored configuration data (e.g., configuration data 428) that indicates a context of operation for the non-volatile memory; wherein determining that the temperature of the non-volatile memory has fallen below the predetermined threshold is performed by a controller and is based on the configuration data.

In one embodiment, the method further comprises: copying the software stored in the first mode to a cache memory (e.g., cache memory 416); wherein decompressing the stored software comprises decompressing the copied software from the cache memory.

In one embodiment, decompressing the stored software and storing the decompressed software are performed further in response to detection of an event, wherein the event is at least one of: an ambient temperature exceeding a predetermined threshold; an ambient temperature falling below a predetermined threshold; an acceleration exceeding a predetermined threshold; a power consumption of the storage device that includes the non-volatile memory exceeding a predetermined threshold; a result from testing the non-volatile memory; a result from testing a computing system that includes the non-volatile memory; a result from testing diagnostics for a vehicle that includes the non-volatile memory; a result from operation of the non-volatile memory; a result from performance testing; a result from failure analysis testing; break-in of the non-volatile memory; physical storage of the storage device that includes the non-volatile memory; transportation of a storage device that includes the non-volatile memory; or an environmental condition that exceeds a predetermined threshold, wherein the environmental condition is associated with physical storage of the storage device that includes the non-volatile memory.

In one example, one or more flags are set in configuration data 428 in response to one or more of the above events. Controller 406 monitors the state of storage device 402 based on these set flags. A manner of storage of data in non-volatile memory 404 can be adjusted based on the configuration data 428. In one example, one or more of the foregoing events is detected by controller 406 and/or host device 408.

In one embodiment, the first mode is a single-level cell (SLC) mode, and the second mode is a multi-level cell (MLC) mode, a triple-level cell (TLC) mode, or a quad-level cell (QLC) mode.

In one embodiment, a system comprises: a storage device configured to store data in a non-volatile memory in a first mode or a second mode having a storage density higher than the first mode; at least one sensor; at least one processing device; and memory containing instructions configured to instruct the at least one processing device to: load software into the non-volatile memory when a temperature of the non-volatile memory is less than a predetermined threshold; store the loaded software in a compressed format in the first mode in the non-volatile memory; expose, when the loaded software is stored in the first mode, the non-volatile memory to a temperature greater than the predetermined threshold; and determine, using the at least one sensor, that the temperature of the non-volatile memory has fallen below the predetermined threshold. In response to determining that the temperature of the non-volatile memory has fallen below the predetermined threshold, the following steps are performed: decompressing the stored software, and storing the decompressed software in the second mode in the non-volatile memory.

In one embodiment, a method comprises: storing software in at least one of a compressed or encrypted format in a first mode in a non-volatile memory; exposing, while the software is stored in the first mode, the non-volatile memory to a temperature greater than a predetermined threshold; determining that the temperature of the non-volatile memory has fallen below the predetermined threshold; and in response to determining that the temperature of the non-volatile memory has fallen below the predetermined threshold: performing at least one of decompressing or decrypting the stored software, and storing the decompressed or decrypted software in a second mode in the non-volatile memory, wherein the second mode has a storage density higher than the first mode.

In one embodiment, compressed data is programmed into a pSLC region of a NAND flash array.

In one embodiment, a set of addresses of a NAND flash array may be designated as a pSLC region. For example, the first N addresses of the array may be designated as the pSLC region. Designating a pSLC region comprises configuring firmware to only store one data bit per cell in the pSLC region. In one embodiment, the pSLC region is accessed by writing to the addresses. In other embodiments, a controller of the NAND array provides commands to access the pSLC region. In one embodiment, the compressed data is sequentially written to the pSLC region (e.g., starting at address zero).

In some embodiments, prior to writing, a method confirms whether the size of the compressed data will fit within the pSLC region. If so, the method continues to write the complete compressed data into the pSLC region. If not, the method may selectively compress and write to the pSLC region a portion of the data to be written. In another embodiment, the size of the pSLC region may be expanded before the compressed data is written to the pSLC region.

In some embodiments, the non-volatile memory 404 is reflow soldered. Reflow soldering may be performed by a reflow soldering oven or other heat source. In some embodiments, the soldering is performed automatically as part of a manufacturing process.

In some embodiments, data in the SLC region 418 is decompressed into the TLC region 420.

In one embodiment, data from the SLC region 418 is read from the non-volatile memory 404. In one embodiment, reading data from the SLC region 418 is performed by a controller (e.g., controller 406) of non-volatile memory 404 and is performed in response to detecting a temperature as being above a predetermined threshold, followed by detecting a temperature being below a predetermined threshold. For example, after soldering at an elevated temperature, a temperature can be detected as being below a predetermined threshold as the memory device cools.

In one embodiment, a method may copy the contents of the SLC region 418 to cache memory 416 (e.g., onboard dynamic random-access memory (DRAM)) that is part of the volatile memory 414. In some embodiments, the method copies the entire contents of the SLC region 418 to cache memory 416 for processing. In other embodiments, the method may stream data from the SLC region 418 for processing, reducing DRAM usage. In some embodiments, the DRAM is sized to accommodate the SLC region 418, and thus the entire contents of the SLC region 418 can be copied to the cache memory 416.

In one embodiment, a method decompresses the SLC data.

In some embodiments, the SLC data is compressed using a lossless compression algorithm. In one embodiment, this algorithm is executed by a codec of the storage device 402 (e.g., a codec implemented by executing firmware 412 on controller 406). Alternatively, the codec can be implemented externally to the storage device 402. In either case, the decompression can include the use of a suitable decompression algorithm based on the lossless compression algorithm used to compress the data stored in the SLC region 418.

In some embodiments, a method performs error code correction (ECC) on the decompressed data. In some embodiments, the method may perform ECC prior to decompressing. The specific type of ECC employed can vary. In some embodiments, the method may utilize the ECC installed within the storage device 402 and used during normal operations.

In some embodiments, a method writes the decompressed SLC data to the TLC region 420 of the non-volatile memory 404.

In some embodiments, the method writes the decompressed data starting at the first TLC address. The method may write the data sequentially as it is decoded from the start of the SLC region 418. In other embodiments, the decompressed data may include indications of addresses to which the data should be written into the TLC region 420.

In an alternative embodiment, a method may decompress the SLC data and store the data within the cache memory 416 until all of the SLC data is decompressed. The method may then perform a bulk write of the decompressed data to the TLC region 420.

In embodiments where the SLC region 418 is implemented as a pseudo-SLC memory (pSLC), the pSLC region may be removed and returned to TLC mode. In this embodiment, the method may copy the decompressed data to the beginning of the entire non-volatile memory 404.

In some embodiments, the method checks to determine if all the compressed data in the SLC region 418 has been decompressed and copied to either the TLC region 420 or to cache memory 416. If not, the method continues to copy any remaining data in the SLC region 418 to the TLC region 420 or cache memory 416.

In some embodiments, the method updates the controller firmware 412 to disable SLC operation of the SLC region 418.

In an optional embodiment, the method may reclaim a region designated as a pSLC region and operate the pSLC region as TLC NAND flash memory. Since pSLC utilizes the underlying TLC architecture, the method may modify the firmware to disable pSLC access to the pSLC region. This effectively converts the pSLC region into a TLC region 420. In some embodiments, the method may copy decompressed data stored in cache memory 416 to the newly-expanded TLC region 420.

In some embodiments, the pSLC region is retained throughout the life of the device. In these embodiments, the compressed data may be retained in the pSLC region. In this manner, TLC region 420 can be reset by re-copying and decompressing data from the SLC region 418 into the TLC region 420. For example, the TLC region 420 may, at some point, become corrupted such as, via subsequent re-soldering or other high heat.

In some embodiments, a method enables access to the TLC region 420 for a host device 408.

In one embodiment, software can be stored in SLC region 418 while the temperature of non-volatile memory 404 is determined and/or expected to exceed a predetermined threshold (e.g., when undergoing reflow soldering, system burn-in, or another high-temperature event).

In one embodiment, access to the non-volatile memory 404 can be denied while the stored software is being decompressed. After completion of the decompression process, read/write/erase and other operations on the non-volatile memory 404 can be enabled.

The disclosure includes various devices which perform the methods and implement the systems described above, including data processing systems which perform these methods, and computer readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and operations may be described as being performed by or caused by software code to simplify description. However, those skilled in the art will recognize what is meant by such expressions is that the functions result from execution of the code by one or more processors, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computing device or other system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions.

In general, a tangible or non-transitory machine readable medium includes any mechanism that provides (e.g., stores) information in a form accessible by a machine (e.g., a computer, mobile device, network device, personal digital assistant, manufacturing tool, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method comprising:
    writing data representative of a software application to a non-volatile memory of a storage device while a temperature of the non-volatile memory is less than a predetermined threshold;
    storing the data in an encrypted format in a first mode in the non-volatile memory;
    exposing, while the data is stored in the first mode, the non-volatile memory to a temperature greater than the predetermined threshold;
    determining that the temperature of the non-volatile memory has fallen below the predetermined threshold; and
    in response to determining that the temperature of the non-volatile memory has fallen below the predetermined threshold:
        decrypting the data, and
        storing the decrypted data in a second mode in the non-volatile memory, wherein the second mode has a storage density higher than the first mode.

2. The method of claim 1, wherein the data is further stored in a compressed format, the method further comprising:
    prior to writing the data representative of the software application, collecting, by a software tool, the software application; and
    compressing the collected software application into the compressed format.

3. The method of claim 2, wherein the collected software application is compressed using a lossless compression algorithm.

4. The method of claim 1, wherein the non-volatile memory is NAND flash memory.

5. The method of claim 1, wherein the non-volatile memory comprises a first region and a second region, the data is stored in the first mode in the first region, and the data is stored in the second mode in the second region.

6. The method of claim 5, further comprising, after storing the decrypted data in the second mode in the non-volatile memory, resizing or removing the first region.

7. The method of claim 5, further comprising, after storing the decrypted data in the second mode in the non-volatile memory, converting the first region to operate in the second mode.

8. The method of claim 5, wherein the first region is configured to operate as a pseudo single-level cell (pSLC) NAND flash region.

9. The method of claim 5, wherein the non-volatile memory is flash memory, the first region is operated in the first mode by a controller that controls storage of data in the flash memory, and the second region is operated in the second mode by the controller.

10. The method of claim 1, wherein the software application is firmware for the storage device, and the firmware controls read and write operations for data stored in the non-volatile memory.

11. The method of claim 1, wherein the software application is firmware.

12. The method of claim 1, further comprising:
    reading the data stored in the first mode from the non-volatile memory;
    wherein decrypting the data comprises decrypting the data read from the non-volatile memory.

13. The method of claim 1, wherein the non-volatile memory stores data for an autonomous vehicle in response to commands received from a controller of the autonomous vehicle, and wherein determining that the temperature of the non-volatile memory has fallen below the predetermined threshold comprises:
    collecting, by the controller, sensor data using at least one sensor of the autonomous vehicle;
    wherein determining that the temperature of the non-volatile memory has fallen below the predetermined threshold is based on the collected sensor data.

14. The method of claim 1, wherein determining that the temperature of the non-volatile memory has fallen below the predetermined threshold comprises:
    reading stored configuration data that indicates a context of operation for the non-volatile memory;
    wherein determining that the temperature of the non-volatile memory has fallen below the predetermined threshold is performed by a controller and is based on the configuration data.

15. The method of claim 1, further comprising:
    copying the data stored in the first mode to a cache memory;
    wherein decrypting the data comprises decrypting the copied data from the cache memory.

16. The method of claim 1, wherein decrypting the and storing the decrypted data are performed further in response to detection of an event, wherein the event is at least one of:
    an ambient temperature exceeding a predetermined threshold;
    an ambient temperature falling below a predetermined threshold;
    an acceleration exceeding a predetermined threshold;
    a power consumption of the storage device that includes the non-volatile memory exceeding a predetermined threshold;
    a result from testing the non-volatile memory;
    a result from testing a computing system that includes the non-volatile memory;

a result from testing diagnostics for a vehicle that includes the non-volatile memory;
a result from operation of the non-volatile memory;
a result from performance testing;
a result from failure analysis testing;
break-in of the non-volatile memory;
physical storage of the storage device that includes the non-volatile memory;
transportation of the storage device that includes the non-volatile memory; or
an environmental condition that exceeds a predetermined threshold, wherein the environmental condition is associated with physical storage of the storage device that includes the non-volatile memory.

17. The method of claim 1, wherein the first mode is a single-level cell (SLC) mode, and the second mode is a multi-level cell (MLC) mode, a triple-level cell (TLC) mode, or a quad-level cell (QLC) mode.

18. A system comprising:
a storage device configured to store data in a non-volatile memory in a first mode or a second mode having a storage density higher than the first mode;
at least one sensor;
at least one processing device; and
memory containing instructions configured to instruct the at least one processing device to:
write data representative of a software application into the non-volatile memory when a temperature of the non-volatile memory is less than a predetermined threshold;
store the data representative of the software application in an encrypted format in the first mode in the non-volatile memory;
expose, when the data representative of the software application is stored in the first mode, the non-volatile memory to a temperature greater than the predetermined threshold;
determine, using the at least one sensor, that the temperature of the non-volatile memory has fallen below the predetermined threshold; and
in response to determining that the temperature of the non-volatile memory has fallen below the predetermined threshold:
decrypt the stored data, and
store the decrypted data in the second mode in the non-volatile memory.

19. A method comprising:
storing data in an encrypted format in a first mode in a non-volatile memory;
exposing, while the data is stored in the first mode, the non-volatile memory to a temperature greater than a predetermined threshold;
determining that the temperature of the non-volatile memory has fallen below the predetermined threshold; and
in response to determining that the temperature of the non-volatile memory has fallen below the predetermined threshold:
decrypting the stored data, and
storing the decrypted data in a second mode in the non-volatile memory, wherein the second mode has a storage density higher than the first mode.

* * * * *